US012672353B2

(12) United States Patent
Mao

(10) Patent No.: US 12,672,353 B2
(45) Date of Patent: Jun. 30, 2026

(54) ARRAY SUBSTRATE AND DISPLAY PANEL

(71) Applicant: GUANGZHOU CHINA STAR OPTOELECTRONICS SEMICONDUCTOR DISPLAY TECHNOLOGY CO., LTD., Guangzhou (CN)

(72) Inventor: Ke Mao, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 0 days.

(21) Appl. No.: 18/932,837

(22) Filed: Oct. 31, 2024

(65) Prior Publication Data

US 2026/0068322 A1 Mar. 5, 2026

(30) Foreign Application Priority Data

Aug. 27, 2024 (CN) .......................... 202411187055.8

(51) Int. Cl.
| | |
|---|---|
| *G02F 1/1362* | (2006.01) |
| *G02F 1/1368* | (2006.01) |
| *H10D 86/40* | (2025.01) |
| *H10D 86/60* | (2025.01) |
| *G02F 1/136* | (2006.01) |

(52) U.S. Cl.
CPC ....... *H10D 86/60* (2025.01); *G02F 1/136209* (2013.01); *G02F 1/136286* (2013.01); *G02F 1/1368* (2013.01); *H10D 86/441* (2025.01); *G02F 1/13606* (2021.01)

(58) Field of Classification Search
CPC ........... G02F 1/13624; G02F 1/136245; G02F 1/13454
See application file for complete search history.

(56) References Cited

U.S. PATENT DOCUMENTS

2008/0068524 A1* 3/2008 Kim ................... G02F 1/136286
349/139
2017/0160616 A1* 6/2017 Kim ..................... G02F 1/13624

* cited by examiner

*Primary Examiner* — Kevin M Nguyen
(74) *Attorney, Agent, or Firm* — The Roy Gross Law Firm, LLC; Roy D. Gross

(57) ABSTRACT

The present application provides an array substrate and a display panel, where the display panel including first sub-pixels and second sub-pixels, the first sub-pixels and the second sub-pixels arranged alternately in a first direction and in a second direction, the first direction being different from the second direction; each first sub-pixel including a first light-transmitting area and a driving device area arranged in the second direction, the first sub-pixel further including a first pixel electrode disposed in the first light-transmitting area and a first driving device disposed in the driving device area, the first driving device being electrically connected to the first pixel electrode; each second sub-pixel including a second light-transmitting area adjacent to the first light-transmitting area and the driving device area, the second sub-pixel further including a second pixel electrode disposed in the second light-transmitting area.

20 Claims, 6 Drawing Sheets

ARRAY SUBSTRATE AND DISPLAY PANEL

CROSS-REFERENCE TO RELATED APPLICATIONS

This application claims priority to Chinese Patent Application No. 202411187055.8, filed on Aug. 27, 2024, the content of which is incorporated herein by reference in its entirety.

TECHNICAL FIELD

The present application relates to display technology, particularly to an array substrate and a display panel.

BACKGROUND

In recent years, with update and iteration of display devices and diversification of products, market has also put forward higher requirements for performance of panel products, such as brightness, transmittance, power consumption, viewing angle, color gamut, and other performance indicators. In liquid crystal displays, brightness is a very important specification, and the most important factor determining brightness is an aperture ratio of pixels, that is, a ratio of an effective light-transmitting area of the pixels to total area of the pixels. In addition to areas corresponding to scan lines and data lines in a liquid crystal display panel where backlight cannot penetrate, areas corresponding to thin-film transistors, storage capacitors, and other components in each sub-pixel also prevent the backlight from penetrating, and light passing through these areas is not controlled by deflection voltage, therefore these areas cannot display correct gray levels and belong to a non-effective light-transmitting area, resulting in a loss of pixel aperture ratio and affecting a display effect of the display panel.

Therefore, how to improve the pixel aperture ratio has become an urgent problem to be solved in this field

SUMMARY

The present application provides an array substrate and a display panel to enhance the pixel aperture ratio.

To solve the above problem, the technical solution provided by the present application is as follows.

The embodiment of the present application provides an array substrate, including first sub-pixels and second sub-pixels, the first sub-pixels and the second sub-pixels arranged alternately in a first direction and in a second direction, the first direction being different from the second direction;

each first sub-pixel including a first light-transmitting area and a driving device area arranged in the second direction, the first sub-pixel further including a first pixel electrode disposed in the first light-transmitting area and a first driving device disposed in the driving device area, the first driving device being electrically connected to the first pixel electrode;

each second sub-pixel including a second light-transmitting area adjacent to the first light-transmitting area and the driving device area, the second sub-pixel further including a second pixel electrode disposed in the second light-transmitting area;

wherein, the second sub-pixel further includes a second driving device electrically connected to the second pixel electrode, the second driving device is adjacent to the first driving device and located in the driving device area.

In the array substrate provided in the embodiment of the present application, the array substrate further includes data lines arranged at intervals in the first direction and scan lines arranged at intervals in the second direction, the data lines and the scan lines intersect to define multiple pixel areas, the first sub-pixels and the second sub-pixels are respectively located in the pixel areas in a one-to-one correspondence;

the first driving device and second driving device in each driving device area are connected to two different ones of the data lines, each data line connects to multiple first driving devices and multiple second driving devices which are the first driving device in each driving area located to one side of the data line and the second driving device in each driving area located to the other side of the data line, and the first driving devices and second driving devices connected to the same data line are arranged alternately.

In the array substrate provided in the embodiment of the present application, each first driving device includes a first gate and a first source corresponding to the first gate, the first source is connected to the data line connected to the first driving device;

each second driving device includes a second gate and a second source corresponding to the second gate, the second source is connected to the data line connected to the second driving device, and the data line has a first notch at a position corresponding to the second source;

wherein, the first gate and the second gate are connected to the same scan line, and the first gate and the second gate are located on the same side of the scan line.

In the array substrate provided in the embodiment of the present application, the first source extends along the first direction and is arranged in a straight line, the second source is arranged in a U-shape, and an opening of the U-shape of the second source faces away from the first source.

In the array substrate provided in the embodiment of the present application, the first driving device further includes a first drain, the first pixel electrode includes a first connecting part connected to the first drain, and the first connecting part is located between the first gate and the second gate;

the second driving device further includes a second drain, the second pixel electrode includes a second connecting part connected to the second drain, and the second connecting part is located within the first notch.

In the array substrate provided in the embodiment of the present application, a distance between the first drain and the scan line is less than a distance between the second drain and the scan line, and an overlapping area between the first drain and the first gate is less than an overlapping area between the second drain and the second gate.

In the array substrate provided in the embodiment of the present application, in the first direction, the first drain and the second drain are overlapped; in the second direction, a width of a portion of the scan line opposite to the first drain is greater than a width of a portion of the scan line opposite to the second drain.

In the array substrate provided in the embodiment of the present application, a distance between the first drain and the scan line is equal to a distance between the second drain and the scan line, and an overlapping area between the first drain and the first gate is equal to an overlapping area between the second drain and the second gate.

In the array substrate provided in the embodiment of the present application, in the first direction, the first drain and the second drain are overlapped; in the second direction, a width of a portion of the scan line opposite to the first drain is equal to a width of a portion of the scan line opposite to the second drain.

In the array substrate provided in the embodiment of the present application, the first pixel electrode and the second pixel electrode are disposed on the same layer; the array substrate further includes a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch, and the second connecting part is further located within the second notch.

In the array substrate provided in the embodiment of the present application, the array substrate further includes a common electrode disposed correspondingly to the first pixel electrode and the second pixel electrode, the common electrode is a planar electrode, the first pixel electrode and the second pixel electrode are comb-shaped electrodes; wherein, the first light-shielding electrode and the second light-shielding electrode have the same potential as that on the common electrode.

In the array substrate provided in the embodiment of the present application, the first pixel electrode and the second pixel electrode both include multiple branch electrodes and connecting electrodes, the branch electrodes are in the same direction as an extension direction of the data line, the connecting electrodes are in the same direction as an extension direction of the scan line, the branch electrodes are arranged at intervals in the first direction, the connecting electrodes are connected to ends of multiple branch electrodes, the branch electrodes are interconnected through the connecting electrodes, the first connecting part and the second connecting part are respectively connected to corresponding ones of the connecting electrodes;

wherein each of the branch electrodes includes a first sub-electrode part and a second sub-electrode part that are interconnected, connecting points of all the first sub-electrode parts and all the second sub-electrode parts of the branch electrodes lie on a straight line, and an angle between the first sub-electrode parts and the straight line is equal to an angle between the second sub-electrode parts and the straight line.

The present application also provides a display panel, which includes one of the array substrates in the aforementioned embodiments.

The beneficial effects of the present application are: in the array substrate and display panel provided by the present application, the display panel including first sub-pixels and second sub-pixels arranged alternately in a first direction and in a second direction; each first sub-pixel including a first light-transmitting area and a driving device area arranged in the second direction, the first sub-pixel further including a first pixel electrode disposed in the first light-transmitting area and a first driving device disposed in the driving device area, the first driving device being electrically connected to the first pixel electrode; each second sub-pixel including a second light-transmitting area adjacent to the first light-transmitting area and the driving device area, the second sub-pixel further including a second pixel electrode disposed in the second light-transmitting area; wherein, the second sub-pixel further includes a second driving device electrically connected to the second pixel electrode, the second driving device is adjacent to the first driving device and located in the driving device area. By disposing the second driving devices of the second sub-pixels within the first sub-pixels, the aperture ratio of the second sub-pixels can be increased, thereby increasing the overall pixel aperture ratio. Moreover, the first sub-pixels and the second sub-pixels are arranged alternately in the first direction and the second direction, which can make the first sub-pixels and the second sub-pixels with different aperture ratios evenly distributed, thereby reducing display unevenness caused by difference in aperture ratio.

BRIEF DESCRIPTION OF THE DRAWINGS

To more clearly illustrate technical solutions in embodiments or existing technology, a brief introduction to drawings required in description of embodiments or the existing technology will be given below. It is obvious that the drawings described below are just some embodiments of the invention, and for those skilled in the art, other drawings can be obtained based on these drawings without need for creative labor.

DETAILED DESCRIPTION

Figure 1:
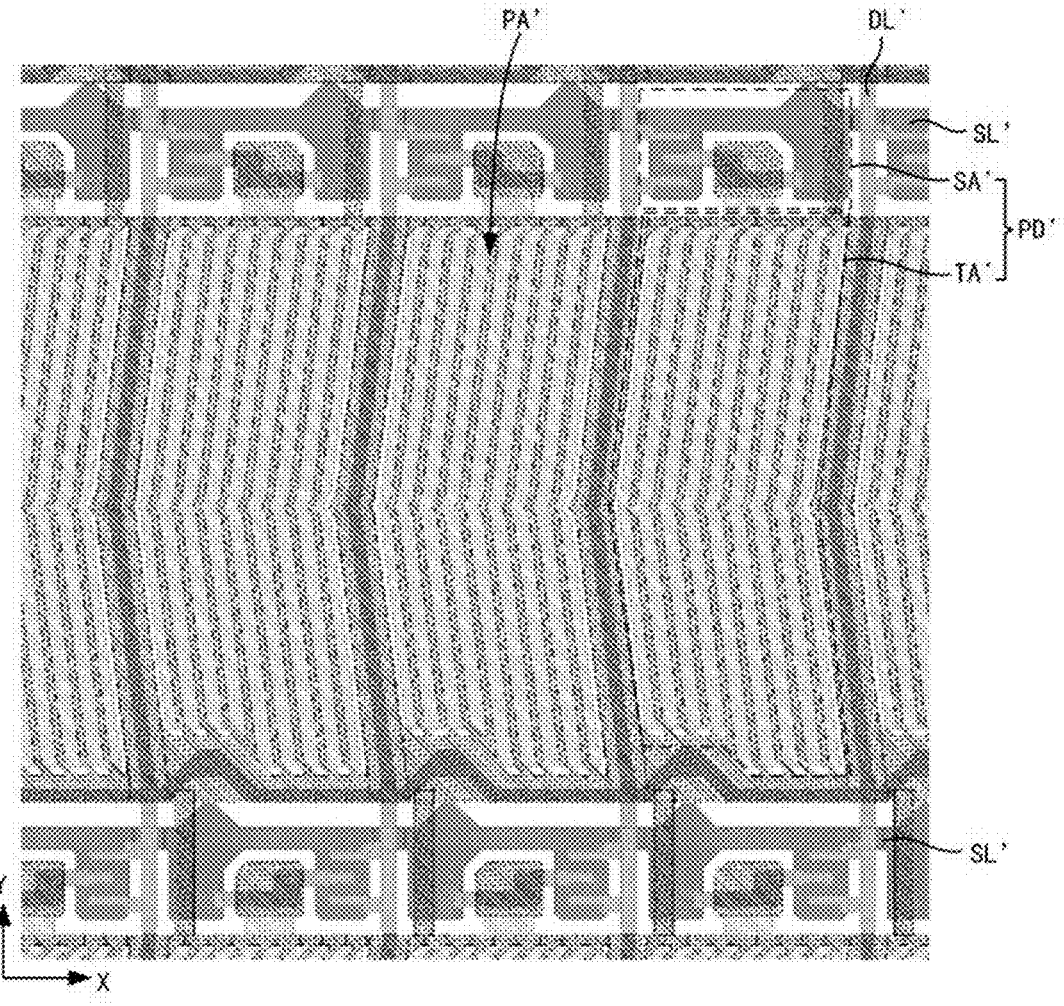
FIG. 1 is a basis for an improvement of the present application, showing a schematic diagram of pixel arrangement.

Following descriptions of the embodiments are made with reference to accompanying drawings to illustrate specific embodiments that can be used to implement the present application. Directional terms mentioned in the present application, such as [up], [down], [front], [back], [left], [right], [inside], [outside], [side], etc., are merely directions for reference in the accompanying drawings. Therefore, the directional terms are used for explaining and understanding the present application, not for limiting the present application. In the drawings, structurally similar units are indicated with same reference numbers. In the drawings, for clear understanding and easy description, thickness of some layers and areas is exaggerated. That is, size and thickness of each component shown in the drawings are arbitrarily shown, but the present application is not limited thereto.

Referring to FIG. 1, FIG. 1 is a basis for an improvement of the present application, showing a schematic diagram of pixel arrangement. Data lines DL' arranged at intervals in the first direction X and scan lines SL' arranged at intervals in the second direction Y intersect to define multiple pixel areas PA'. Each pixel area PA' includes the sub-pixel PD', and each sub-pixel PD' includes the light-transmitting area TA' and the driving device area SA', and a structure of each sub-pixel PD' is completely the same. The light-transmitting area TA' allows light of a backlight to pass through, while the driving device area SA' cannot allow the light of the backlight to pass through due to the disposed devices therein such as transistors and storage capacitors. Therefore, presence of the driving device area SA' within each sub-pixel PD' results in a loss of pixel aperture ratio, affecting a display effect of a display panel.

To this end, the present application provides an array substrate and the display panel.

Figure 2:
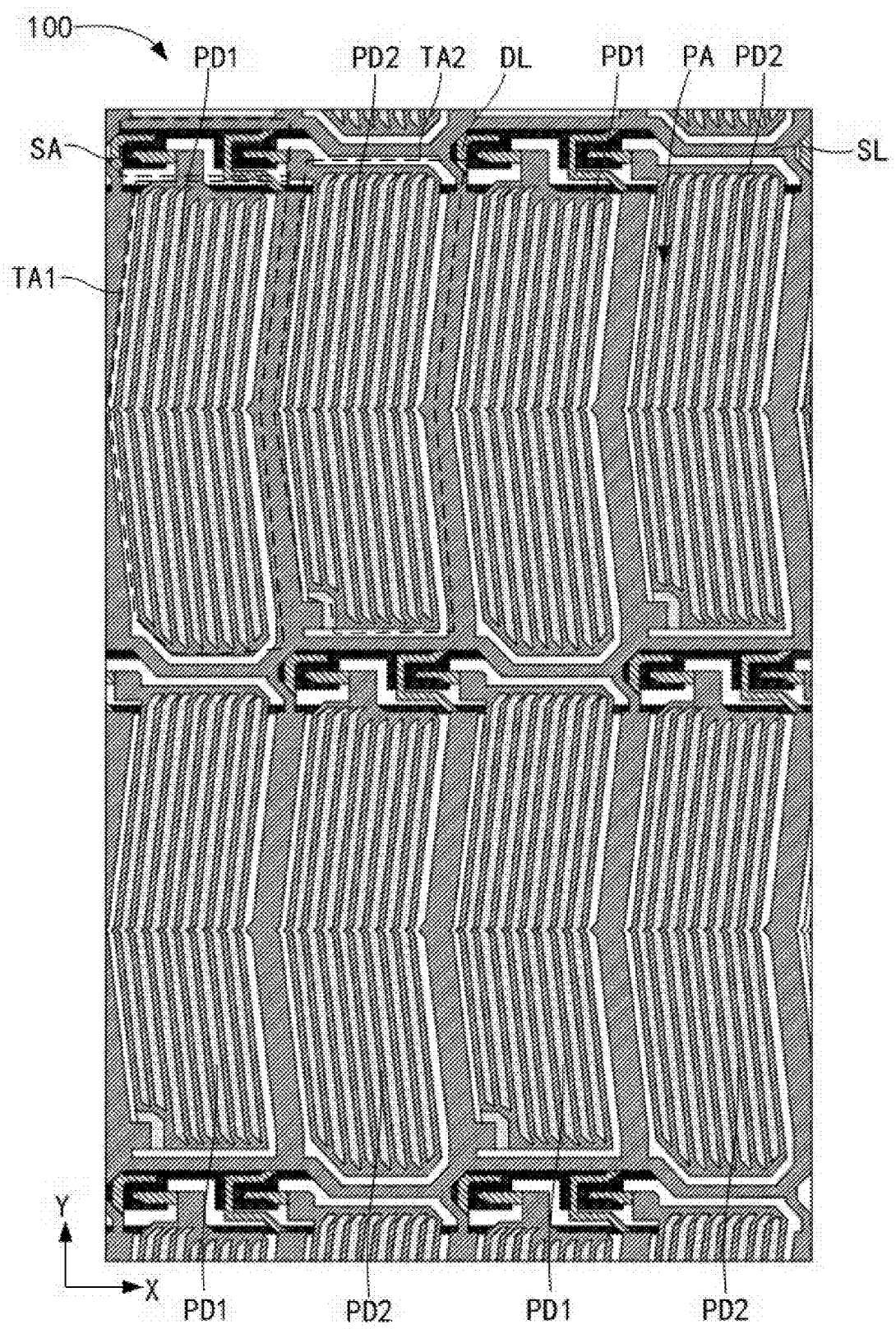
FIG. 2 is a partial planar structure diagram of an array substrate provided in embodiments of the present application.
Figure 3:
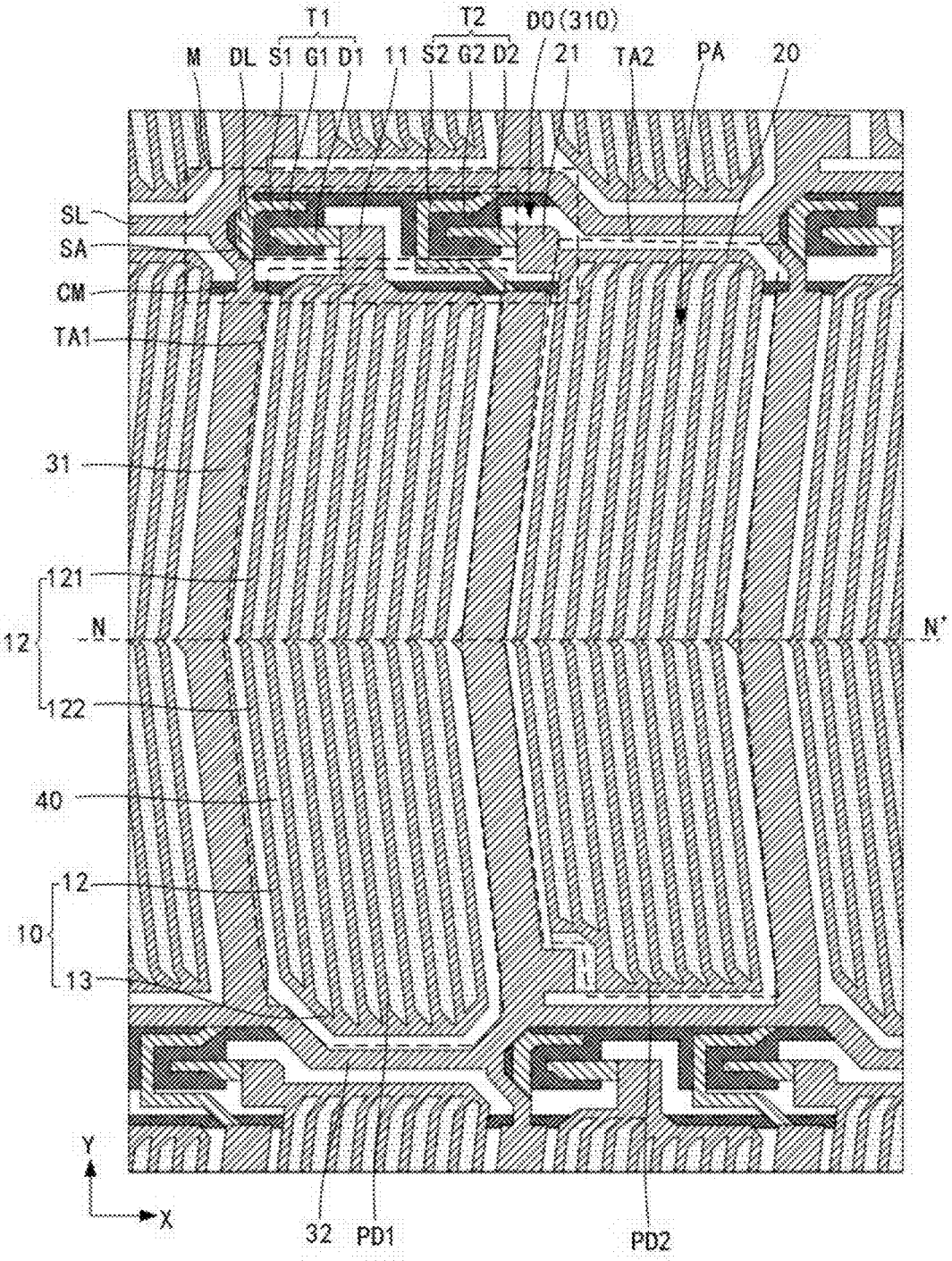
FIG. 3 is a detailed structure diagram of a first sub-pixel and a second sub-pixel in FIG. 2.
Figure 4:
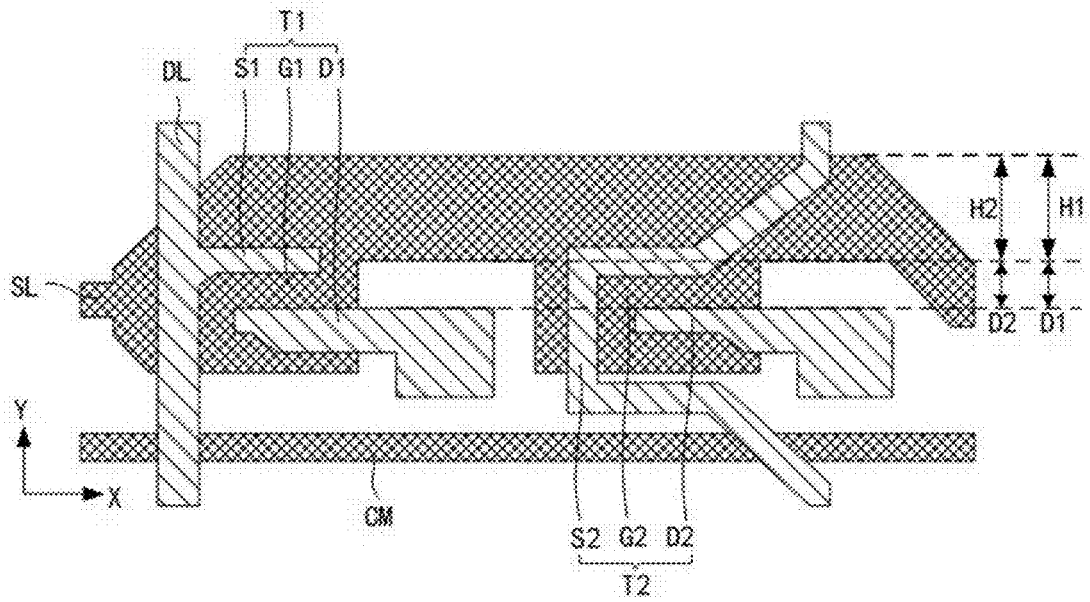
FIG. 4 is a detailed structure diagram of a first driving device and a second driving device at position M in FIG. 3.

Please refer to FIGS. 1 to 4, FIG. 2 is a partial planar structure diagram of the array substrate provided in the embodiment of the present application, FIG. 3 is a detailed structure diagram of a first sub-pixel and a second sub-pixel in FIG. 2, FIG. 4 is a detailed structure diagram of a first driving device and a second driving device at position M in FIG. 3. Referring to FIG. 2, the array substrate 100 includes multiple first sub-pixels PD1 and multiple second sub-pixels PD2, which are arranged alternately in the first direction X, and the first sub-pixels PD1 and the second sub-pixels PD2 are also arranged alternately in the second direction Y. That is, the first sub-pixels PD1 and the second sub-pixels PD2 are arranged alternately in both the first direction X and the second direction Y. Wherein, the first direction X is different from the second direction Y, for example, the first direction X is a row direction, and the second direction Y is a column direction, the first direction X and the second direction Y are perpendicular, but the present application is not limited thereto, the first direction X and the second direction Y can also be disposed at other angles.

The first sub-pixel PD1 includes the first pixel electrode 10, and the first driving device T1 located on one side of the first pixel electrode 10, the first driving device T1 is electrically connected to the first pixel electrode 10. The second sub-pixel PD2 includes the second pixel electrode 20, and the second driving device T2 electrically connected to the second pixel electrode 20. Wherein, the second driving device T2 and the first driving device T1 are located on the same side of the first pixel electrode 10, and the second driving device T2 is adjacent to the first driving device T1.

Specifically, the first sub-pixel PD1 includes the first light-transmitting area TA1 and the driving device area SA arranged in the second direction Y, the first sub-pixel PD1 also includes the first pixel electrode 10 disposed in the light-transmitting area and the first driving device T1 disposed in the driving device area SA, the first driving device T1 is electrically connected to the first pixel electrode 10. The second sub-pixel PD2 includes the second light-transmitting area TA2 adjacent to the first light-transmitting area TA1 and the driving device area SA, the second sub-pixel electrode PD2 also includes the second driving device T2, and the second pixel electrode 20 disposed in the second light-transmitting area TA2, the second driving device T2 is electrically connected to the second pixel electrode 20. The second driving device T2 and the first driving device T1 are located on the same side of the first pixel electrode 10, and the second driving device T2 is located in the driving device area SA, the second driving device T2 is adjacent to the first driving device T1. By arranging the second driving device T2 of the second sub-pixel PD2 in the driving device area SA of the first sub-pixel PD1, there is no need to arrange a driving device area in the second sub-pixel PD2, thereby increasing an aperture ratio of the second sub-pixel PD2, and thus increasing an overall pixel aperture ratio. Moreover, the first sub-pixels PD1 and the second sub-pixels PD2 are arranged alternately in the first direction X and the second direction Y, which can make the first sub-pixels PD1 and the second sub-pixels PD2 with different aperture ratios evenly distributed, thereby reducing display unevenness caused by difference in the aperture ratio.

Specifically, continuing to refer to FIG. 2, the array substrate 100 also includes data lines DL arranged at intervals in the first direction X and scan lines SL arranged at intervals in the second direction Y, the data lines DL and the scan lines SL intersect to define multiple pixel areas PA, the first sub-pixels PD1 and the second sub-pixels PD2 are located in the pixel areas PA in a one-to-one correspondence. Multiple first sub-pixels PD1 and multiple second sub-pixels PD2 are arranged in the column direction to form a column of sub-pixels, and multiple first sub-pixels PD1 and multiple second sub-pixels PD2 are arranged in the row direction to form a row of sub-pixels. The data lines DL are each located between adjacent two columns of sub-pixels, and each of the data lines DL connects to a column of the sub-pixels. The scan lines SL are each located between adjacent two rows of sub-pixels, and each of the scan lines SL connects to a row of the sub-pixels.

The first sub-pixel PD1 includes the first light-transmitting area TA1 and the driving device area SA, while the second sub-pixel PD2 only includes the second light-transmitting area TA2 and does not include the driving device area, that is, devices such as the second driving device T2 of the second sub-pixel PD2 are integrated into the driving device area SA of the first sub-pixel PD1, thereby increasing an aperture ratio of the second sub-pixel PD2, making an area of the second light-transmitting area TA2 greater than an area of the first light-transmitting area TA1, and thus increasing the overall pixel aperture ratio.

The first sub-pixels PD1 and the second sub-pixels PD2 are arranged alternately in the first direction X and the second direction Y, which can make the first sub-pixels PD1 and the second sub-pixels PD2 with different aperture ratios evenly distributed, so that the aperture ratios in each column of the sub-pixels have alternatively small and large values, and the aperture ratios of the sub-pixels in adjacent columns are consistent, thereby reducing display unevenness caused by the difference in aperture ratio.

In each driving device area SA, the adjacent first driving device T1 and second driving device T2 are connected to different data lines DL. For example, in a driving device area SA located between two adjacent data lines DL, the first driving device T1 in this driving device area SA is connected to one of the two adjacent data lines DL, and the second driving device T2 is connected to the other of the two adjacent data lines DL, and both the first driving device T1 and the second driving device T2 are connected to the data line DL that is close to them. The first driving device T1 and the second driving device T2 are both thin-film transistors.

Each data line DL connects to multiple first driving devices T1 and multiple second driving devices T2, and the first driving devices T1 and second driving devices T2 connected to the same data line DL are arranged alternately. That is, in an extension direction of the data line DL, the first driving devices T1 and the second driving devices T2 on the same data line DL are arranged alternately. And among the multiple first driving devices T1 and multiple second driving devices T2 connected to the same data line DL, the first driving devices T1 are located on one side of the data line DL, while the second driving devices T2 are located on the other side of the data line DL.

Since the first driving devices T1 and the second driving devices T2 connected to the same data line DL are arranged alternately, and the first driving device T1 and the second driving device T2 in the same driving device area SA are connected to different data lines DL, this allows multiple first driving devices T1 and multiple second driving devices T2 to be connected on each of two adjacent data lines DL. And regarding two adjacent data lines in the first direction X, the first driving devices T1 on the first data line DL are disposed correspondingly to the second driving devices T2 on the second data line DL, and the second driving devices T2 on the first data line DL are disposed correspondingly to the first driving devices T1 on the second data line DL. In other words, the data lines DL are divided into a first type of data lines DL and a second type of data lines DL, where the first type of data lines DL and the second type of data lines DL are arranged alternately in the first direction X, and the first driving devices T1 on the first type of data lines DL are disposed correspondingly to the second driving devices T2 on the second type of data lines DL, while the second driving devices T2 on the first type of data lines DL are disposed correspondingly to the first driving devices T1 on the second type of data lines DL. This ensures that a total capacitance on adjacent data lines DL is same, thereby avoiding vertical display unevenness caused by differences in charging rates due to capacitance differences.

Referring to FIG. 3, each of the first driving devices T1 includes the first gate G1 and the first source S1 corresponding to the first gate G1, the first source S1 is connected to the corresponding data line DL to achieve the connection between the first driving device T1 and the data line DL. The corresponding data line DL connected to the first source S1 refers to the data line DL that is adjacent to the first source S1. Optionally, the first source S1 is integrally formed with the corresponding data line DL. The first source S1 extends along the first direction X and is arranged in a straight line.

Each of the second driving devices T2 includes the second gate G2 and the second source S2 corresponding to the second gate G2, the second source S2 is connected to the corresponding data line DL. The corresponding data line DL connected to the second source S2 refers to the data line DL that is adjacent to the second source S2. For example, in the same driving device area SA, the first source S1 and the second source S2 are located between two adjacent data lines DL, where the first source S1 is close to one of the data lines DL, and the second source S2 is close to the other data line DL, with the first source S1 being connected to the adjacent data line DL and the second source S2 connected to the other adjacent data line DL.

Each data line DL has the first notch DO at a position corresponding to the second source S2, to achieve a connection between the second driving device T2 and the second pixel electrode 20. The portions of the data lines DL on both sides of the first notch DO are connected together through the second source S2. Optionally, the second source S2 is integrally formed with the corresponding data line DL. The second source S2 is arranged in a U-shape, with an opening of the U-shape facing away from the first source S1 and towards the first notch DO.

The first gate G1 and the second gate G2 are connected to the same scan line SL, and the first gate G1 and the second gate G2 are located on the same side of the scan line SL to which they are connected, to fully utilize space of the driving device area SA in the first direction X, avoiding an integration of the second driving device T2 connected to the second pixel electrode 20 into the driving device area SA of the first sub-pixel PD1 (which would increase an occupied area of the driving device area SA in the second direction Y), thereby not further increasing the occupied area of the driving device area SA of the first sub-pixel PD1.

In the first sub-pixel PD1, the first gate G1 and the second gate G2 are located between the first pixel electrode 10 and the corresponding scan line SL, to avoid the first pixel electrode 10 from being too close to or overlapping with the corresponding scan line SL, thereby reducing a parasitic capacitance between the first pixel electrode 10 and the corresponding scan line SL. The scan line SL corresponding to the first pixel electrode 10 refers to the scan line SL that is connected to the first drive device T1 and the second drive device T2 within the first sub-pixel PD1 where the first pixel electrode 10 is located.

Continuing to refer to FIG. 3, the first driving device T1 also includes the first drain D1, which is arranged opposite to the first source S1, and both the first drain D1 and the first source S1 are arranged corresponding to the first gate G1. The first drain D1 and the first source S1 both have an overlapping portion with the first gate G1. The first pixel electrode 10 includes the first connecting part 11 connected to the first drain D1, and the first connecting part 11 is located between the first gate G1 and the second gate G2. In the first direction X, the first gate G1, the first connecting part 11, and the second gate G2 are arranged in sequence, to fully utilize space of the driving device area SA in the first direction X, thereby reducing the occupied area of the driving device area SA in the second direction Y, thus reducing the overall occupied area of the driving device area SA and increasing an area of the first light-transmitting area TA1, improving a pixel aperture ratio of the first sub-pixel PD1.

The second driving device T2 also includes a second drain D2, which is arranged opposite to the second source S2, and the second drain D2 is located within the U-shaped opening of the second source S2. The second drain D2 and the second source S2 are both correspondingly arranged corresponding to the second gate electrode G2, and the second drain D2 and the second source S2 both have an overlapping portion with the second gate electrode G2. The second pixel electrode 20 includes the second connecting part 21 connected to the second drain D2, and the second connecting part 21 is located within the first notch DO, so that the second connecting part 21 does not occupy a pixel aperture of the first sub-pixel PD1 or a pixel aperture of the second sub-pixel PD2. In the first direction X, the first gate G1, the first connecting part 11, the second gate G2, and the second connecting part 21 are arranged in sequence.

Continuing to refer to FIG. 3, the first pixel electrode 10 and the second pixel electrode 20 are disposed on the same layer; the array substrate 100 also includes the first light-shielding electrode 31 and the second light-shielding electrode 32 disposed on the same layer as the first pixel electrode 10, that is, the first light-shielding electrode 31, the second light-shielding electrode 32, the first pixel electrode 10, and the second pixel electrode 20 are disposed on the same layer. In this application, "disposed on the same layer" means that in a preparation process, a film layer formed from same material is patterned to obtain at least two different structures, and these at least two different structures are disposed on the same layer. For example, the first pixel electrode 10 and the second pixel electrode 20 in this embodiment are obtained by patterning the same conductive film layer, so the first pixel electrode 10 and the second pixel electrode 20 are disposed on the same layer. Materials of the first pixel electrode 10 and the second pixel electrode 20 include transparent conductive materials such as indium tin oxide (ITO).

The first light-shielding electrode 31 is disposed corresponding to the data line DL to shield the data line DL. The second light-shielding electrode 32 is disposed corresponding to the scan line SL to shield the scan line SL. The first light-shielding electrode 31 is in the same direction as an extension direction of the data line DL, and the second light-shielding electrode 32 is in the same direction as an extension direction of the scan line SL, and the first light-shielding electrode 31 and the second light-shielding electrode 32 are interconnected to form a grid structure. The first light-shielding electrode 31 has the second notch 310 at a position corresponding to the first notch DO, and the second connecting part 21 is also located within the second notch 310, so that the second connecting part 21 is insulated from the first light-shielding electrode 31 and/or the second light-shielding electrode 32.

The array substrate 100 also includes the common electrode 40 corresponding to the first pixel electrode 10 and the second pixel electrode 20, the common electrode 40 is a planar electrode, and the first pixel electrode 10 and the second pixel electrode 20 are comb-shaped electrodes. Wherein, the first light-shielding electrode 31 and the second light-shielding electrode 32 have same potential as that on the common electrode 40. Optionally, a material of the common electrode 40 is the same as materials of the first pixel electrode 10 and the second pixel electrode 20.

The first pixel electrode 10 and the second pixel electrode 20 both include multiple branch electrodes 12 and connecting electrodes 13. Taking the first pixel electrode 10 as an example, continuing to refer to FIG. 3, the branch electrodes 12 are in the same direction as the extension direction of the data line DL, and the connecting electrodes 13 are in the same direction as the extension direction of the scan line SL, multiple branch electrodes 12 are arranged at intervals in the first direction X, the connecting electrodes 13 are connected to ends of multiple branch electrodes 12, the multiple branch electrodes 12 are interconnected through the connecting electrodes 13, the first connecting part 11 and the second connecting part 21 are respectively connected to the corresponding connecting electrodes 13, that is, the first connecting part 11 is connected to the connecting electrode 13 of the first pixel electrode 10, and the second connecting part 21 is connected to the connecting electrode of the second pixel electrode 20.

Wherein, the branch electrode 12 includes the first sub-electrode part 121 and the second sub-electrode part 122 that are interconnected, connecting points of the first sub-electrode parts 121 and the second sub-electrode parts 122 of multiple branch electrodes 12 are on a straight line N-N', an angle between the first sub-electrode parts 121 and the straight line N-N' is equal to an angle between the second sub-electrode parts 122 and the straight line N-N', and the angle is greater than 0 degrees and less than 90 degrees. The angle between the first sub-electrode parts 121 and the straight line N-N' is defined as a first angle, and the angle between the second sub-electrode parts 122 and the straight line N-N' is defined as a second angle, the first angle and the second angle are symmetric about the straight line N-N', allowing the first sub-electrode parts 121 and the second sub-electrode parts 122 to extend in different directions. That is, the first sub-electrode parts 121 and the second sub-electrode parts 122 are both inclined, and directions of inclination are different, so that the first pixel electrode 10 and the second pixel electrode 20 can both be divided into two domains. The first sub-electrode part 121 forms one domain, and the second sub-electrode part 122 forms another domain, the two domains can form different liquid crystal orientations, thereby ameliorating color bias at wide viewing angles.

Optionally, the array substrate 100 also includes the auxiliary electrode CM disposed on the same layer as the scan line SL. The auxiliary electrode CM is in the same direction as the extension direction of the scan line SL, and the auxiliary electrode CM is spaced apart from the scan line SL. The auxiliary electrode CM is connected to the first light-shielding electrode 31 and/or the second light-shielding electrode 32 to reduce an impedance of the first light-shielding electrode 31 and/or the second light-shielding electrode 32.

In one embodiment, referring to FIG. 4, the distance D1 between the first drain D1 and the scan line SL is equal to the distance D2 between the second drain D2 and the scan line SL. And an overlapping area between the first drain D1 and the first gate G1 is greater than an overlapping area between the second drain D2 and the second gate G2, which reduces difference in gate-drain capacitance between the first driving device T1 and the second driving device T2, and ameliorates difference in feed-through voltage between the first sub-pixel PD1 and the second sub-pixel PD2.

Optionally, in the first direction X, the first drain D1 and the second drain D2 are overlapped. In the second direction Y, the width H1 of the portion of the scan line SL opposite to the first drain D1 is equal to the width H2 of the portion of the scan line SL opposite to the second drain D2.

Figure 5:
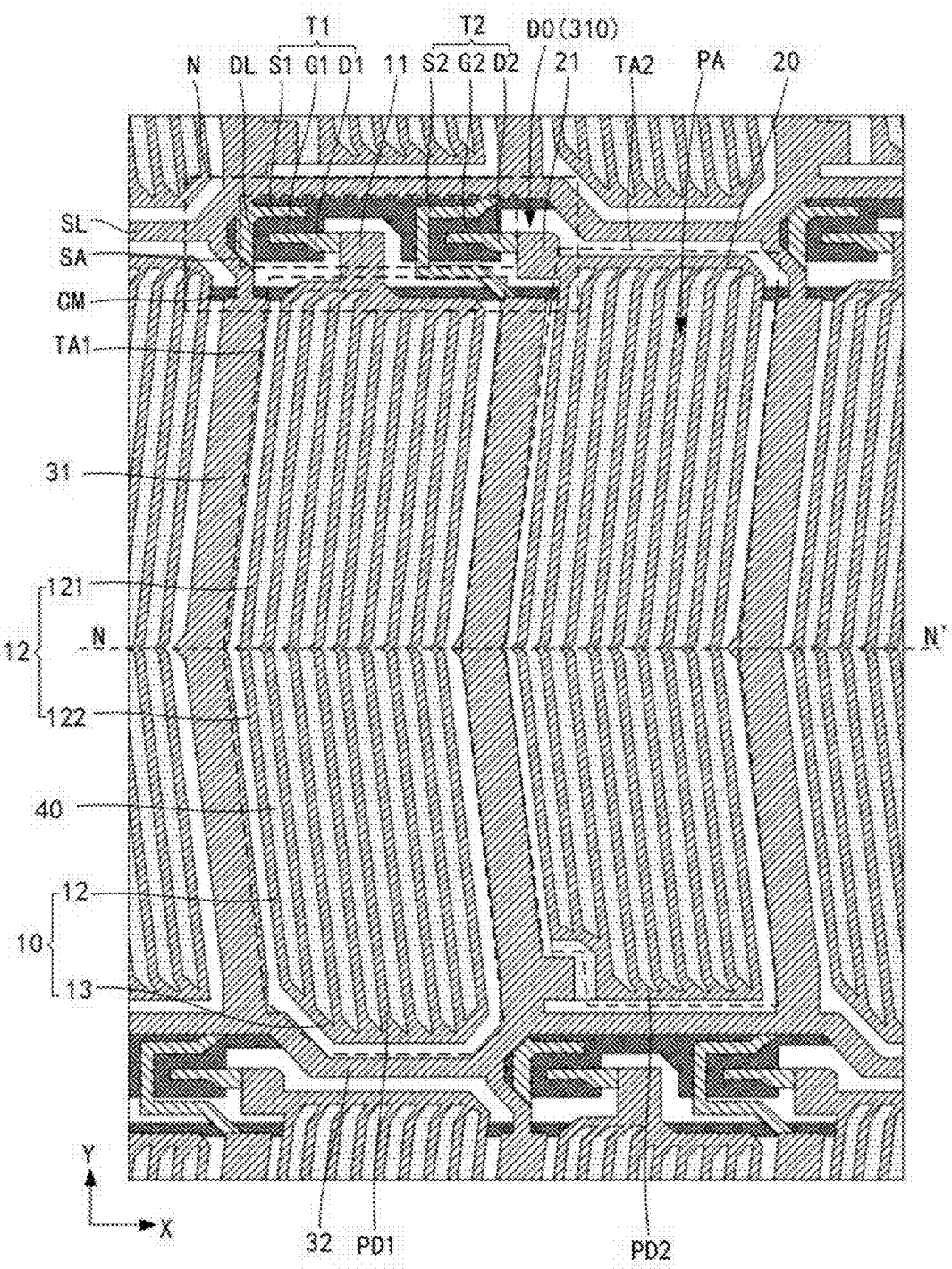
FIG. 5 is another detailed structure diagram of the first sub-pixel and the second sub-pixel provided in embodiments of the present application.
Figure 6:
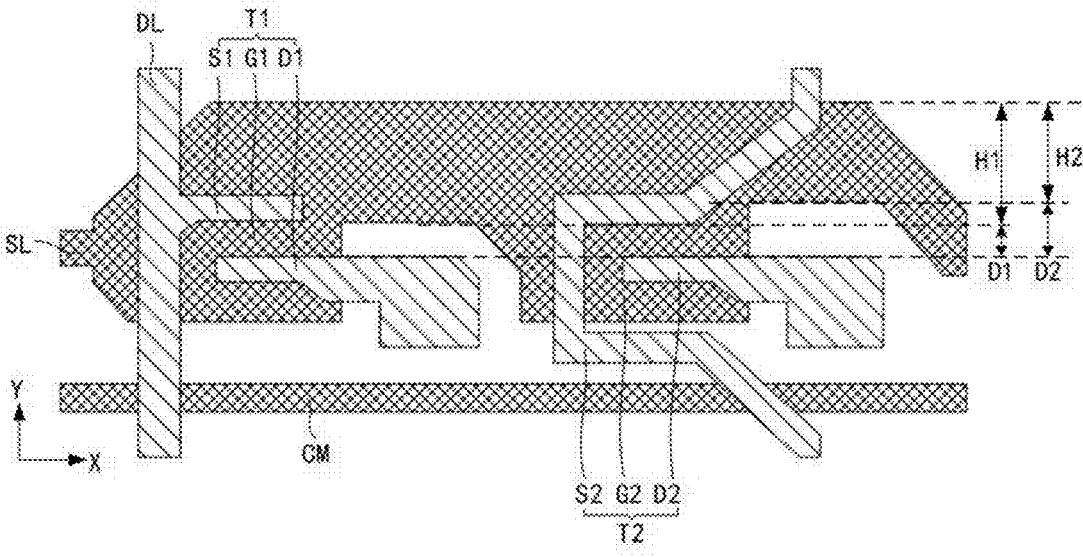
FIG. 6 is a detailed structure diagram of a first driving device and a second driving device at position N in FIG. 5.
Figure 7:
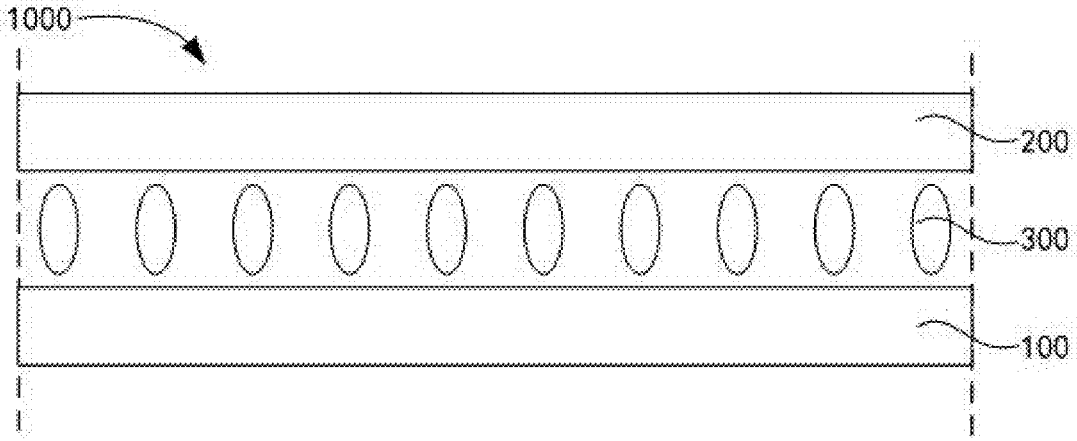
FIG. 7 is a cross-sectional structure diagram of a display panel provided in embodiments of the present application.

In an embodiment, referring to FIGS. 1 to 6, FIG. 5 is another detailed structure diagram of the first sub-pixel and the second sub-pixel provided in embodiments of the present application, and FIG. 6 is another detailed structure diagram of the first driving device T1 and the second driving device T2 at position N in FIG. 5. Referring to FIGS. 5 and 6, different from the embodiment corresponding to FIG. 4, the distance D1 between the first drain D1 and the scan line SL is less than the distance D2 between the second drain D2 and the scan line SL. And an overlapping area between the first drain D1 and the first gate G1 is equal to an overlapping area between the second drain D2 and the second gate G2, which may avoid a difference in gate-drain capacitance between the first driving device T1 and the second driving device T2 caused by a poor alignment accuracy of the film layers.

Optionally, in the first direction X, the first drain D1 and the second drain D2 are overlapped. In the second direction Y, the width H1 of the portion of the scan line SL opposite to the first drain D1 is greater than the width H2 of the portion of the scan line SL opposite to the second drain D2. Other descriptions may be found in the aforementioned embodiments and will not be repeated here.

Based on the same inventive concept, the present application also provides a display panel. Please refer to FIGS. 1 to 7, FIG. 7 is a cross-sectional structure diagram of the display panel provided in the embodiments of the present application. The display panel includes one of the array substrates 100 from the aforementioned embodiments. The display panel is a liquid crystal display panel or the like, and this embodiment takes the display panel as the liquid crystal display panel as an example for illustration. Specifically, referring to FIG. 7, the display panel 1000 includes a first substrate and a second substrate that are disposed opposite to each other, one of the first substrate and the second substrate is the array substrate 100 from one of the aforementioned embodiments. This embodiment takes the first substrate as the array substrate 100 as an example for illustration, then the second substrate 200 is a color film substrate. The display panel 1000 also includes liquid crystal molecules 300 that are sandwiched between the array substrate 100 and the second substrate 200.

It can be known from the aforementioned embodiments:

The present application provides the array substrate and the display panel, where the display panel includes first sub-pixels and second sub-pixels that are arranged alternately in the first direction and the second direction, each first sub-pixel includes the first light-transmitting area and the driving device area arranged in the second direction. The first sub-pixel also includes the first pixel electrode disposed in the first light-transmitting area, and the first driving device disposed in the driving device area, the first driving device is electrically connected to the first pixel electrode; each second sub-pixel includes the second light-transmitting area that is adjacent to the first light-transmitting area and the driving device area. The second sub-pixel also includes the second pixel electrode disposed in the second light-transmitting area. The second sub-pixel also includes the second driving device that is electrically connected to the second pixel electrode. The second driving device is adjacent to the first driving device and located in the driving device area. By disposing the second driving device of the second sub-pixel within the first sub-pixel, the aperture ratio of the second sub-pixel can be increased, thereby increasing the overall pixel aperture ratio. Moreover, the first sub-pixels and the second sub-pixels are arranged alternately in the first direction and the second direction, which can make the first sub-pixels and the second sub-pixels with different aperture ratios evenly distributed, thereby reducing the display unevenness caused by the difference in aperture ratio.

In the aforementioned embodiments, each embodiment has its own focus, and the parts that are not detailed in one embodiment can refer to the relevant descriptions in other embodiments.

The above provides a detailed introduction to the embodiments of the present application. Specific examples are used in this paper to illustrate principles and implementation methods of the present application. The descriptions of the embodiments are only for helping to understand technical solutions and core ideas of the present application. Those ordinary skilled in the art should understand that they can still modify the technical solutions recorded in the aforementioned embodiments, or equivalently replace some technical features. And these modifications or substitutions do not cause an essence of the corresponding technical solutions to deviate from a scope of the technical solutions of the various embodiments of the present application.

What is claimed is:

1. An array substrate, comprising first sub-pixels and second sub-pixels, the first sub-pixels and the second sub-pixels being arranged alternately in a first direction and in a second direction, the first direction being different from the second direction;

each first sub-pixel comprising a first light-transmitting area and a driving device area arranged in the second direction, the first sub-pixel further comprising a first pixel electrode disposed in the first light-transmitting area and a first driving device disposed in the driving device area, the first driving device being electrically connected to the first pixel electrode;

each second sub-pixel comprising a second light-transmitting area adjacent to the first light-transmitting area and the driving device area, the second sub-pixel further comprising a second pixel electrode disposed in the second light-transmitting area;

wherein the second sub-pixel further comprises a second driving device electrically connected to the second pixel electrode, the second driving device is adjacent to the first driving device and located in the driving device area;

the second light-transmitting area has an area greater than an area of the first light-transmitting area;

the array substrate further comprises data lines arranged at intervals in the first direction; and each second driving device comprises a second gate and a second source corresponding to the second gate, the second source is connected to one of the data lines connected to the second driving device, and the one of the data lines connected to the second driving device has a first notch at a position corresponding to the second source.

2. The array substrate according to claim 1, wherein the array substrate further comprises scan lines arranged at intervals in the second direction, the data lines and the scan lines intersect to define multiple pixel areas, the first sub-pixels and the second sub-pixels are respectively located in the pixel areas in a one-to-one correspondence;

the first driving device and second driving device in each driving device area are connected to two different ones of the data lines, respectively, each data line connects to multiple first driving devices and multiple second driving devices which are the first driving device in each driving area located to one side of the data line and the second driving device in each driving area located to the other side of the data line, and the first driving devices and the second driving devices connected to the same data line are arranged alternately.

3. The array substrate according to claim 2, wherein each first driving device comprises a first gate and a first source corresponding to the first gate, the first source is connected to one of the data lines connected to the first driving device;

wherein, the first gate and the second gate are connected to the same scan line, and the first gate and the second gate are located on the same side of the scan line.

4. The array substrate according to claim 3, wherein the first source extends along the first direction and is arranged in a straight line, the second source is arranged in a U-shape, and an opening of the U-shape of the second source faces away from the first source.

5. The array substrate according to claim 4, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

6. The array substrate according to claim 5, wherein the first pixel electrode and the second pixel electrode both comprise multiple branch electrodes and connecting electrodes, the branch electrodes are in the same direction as an extension direction of the data line, the connecting electrodes are in the same direction as an extension direction of the scan line, the branch electrodes are arranged at intervals in the first direction, the connecting electrodes are connected to ends of multiple branch electrodes, the branch electrodes are interconnected through the connecting electrodes, the first connecting part and the second connecting part are respectively connected to corresponding ones of the connecting electrodes;

wherein each of the branch electrodes comprises a first sub-electrode part and a second sub-electrode part that are interconnected, connecting points of all the first sub-electrode parts and all the second sub-electrode parts of the branch electrodes lie on a straight line, and an angle between the first sub-electrode parts and the straight line is equal to an angle between the second sub-electrode parts and the straight line.

7. The array substrate according to claim 3, wherein the first driving device further comprises a first drain, the first pixel electrode comprises a first connecting part connected to the first drain, and the first connecting part is located between the first gate and the second gate;

the second driving device further comprises a second drain, the second pixel electrode comprises a second connecting part connected to the second drain, and the second connecting part is located within the first notch.

8. The array substrate according to claim 7, wherein a distance between the first drain and the scan line is less than a distance between the second drain and the scan line, and an overlapping area between the first drain and the first gate is less than an overlapping area between the second drain and the second gate.

9. The array substrate according to claim 8, wherein in the first direction, the first drain and the second drain are overlapped;

in the second direction, a width of a portion of the scan line opposite to the first drain is greater than a width of a portion of the scan line opposite to the second drain.

10. The array substrate according to claim 9, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

11. The array substrate according to claim 8, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

12. The array substrate according to claim 7, wherein a distance between the first drain and the scan line is equal to a distance between the second drain and the scan line, and an overlapping area between the first drain and the first gate is equal to an overlapping area between the second drain and the second gate.

13. The array substrate according to claim 12, wherein in the first direction, the first drain and the second drain are overlapped;

in the second direction, a width of a portion of the scan line opposite to the first drain is equal to a width of a portion of the scan line opposite to the second drain.

14. The array substrate according to claim 13, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

15. The array substrate according to claim 12, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

16. The array substrate according to claim 7, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

17. The array substrate according to claim 3, wherein the first pixel electrode and the second pixel electrode are disposed on the same layer;

the array substrate further comprises a first light-shielding electrode and a second light-shielding electrode disposed on the same layer as the first pixel electrode, the first light-shielding electrode is disposed correspondingly to the data line, the second light-shielding electrode is disposed correspondingly to the scan line, the first light-shielding electrode and the second light-shielding electrode are interconnected, and the first light-shielding electrode has a second notch at a position corresponding to the first notch.

18. The array substrate according to claim 17, wherein the array substrate further comprises a common electrode disposed correspondingly to the first pixel electrode and the second pixel electrode, the common electrode is a planar electrode, the first pixel electrode and the second pixel electrode are comb-shaped electrodes;

wherein, the first light-shielding electrode and the second light-shielding electrode have the same potential as that on the common electrode.

19. A display panel, comprising an array substrate, the array substrate comprising first sub-pixels and second sub-pixels, the first sub-pixels and the second sub-pixels being arranged alternately in a first direction and in a second direction, the first direction being different from the second direction;

each first sub-pixel comprising a first light-transmitting area and a driving device area arranged in the second direction, the first sub-pixel further comprising a first pixel electrode disposed in the first light-transmitting area and a first driving device disposed in the driving device area, the first driving device being electrically connected to the first pixel electrode;

each second sub-pixel comprising a second light-transmitting area adjacent to the first light-transmitting area and the driving device area, the second sub-pixel further comprising a second pixel electrode disposed in the second light-transmitting area;

wherein the second sub-pixel further comprises a second driving device electrically connected to the second pixel electrode, the second driving device is adjacent to the first driving device and located in the driving device area;

the second light-transmitting area has an area greater than an area of the first light-transmitting area;

the array substrate further comprises data lines arranged at intervals in the first direction; and each second driving device comprises a second gate and a second source corresponding to the second gate, the second source is connected to one of the data lines connected to the second driving device, and the one of the data lines connected to the second driving device has a first notch at a position corresponding to the second source.

20. A display panel, comprising an array substrate, the array substrate comprising first sub-pixels and second sub-pixels, the first sub-pixels and the second sub-pixels being arranged alternately in a first direction and in a second direction, the first direction being different from the second direction;

each first sub-pixel comprising a first light-transmitting area and a driving device area arranged in the second direction, the first sub-pixel further comprising a first pixel electrode disposed in the first light-transmitting area and a first driving device disposed in the driving device area, the first driving device being electrically connected to the first pixel electrode;

each second sub-pixel comprising a second light-transmitting area adjacent to the first light-transmitting area and the driving device area, the second sub-pixel further comprising a second pixel electrode disposed in the second light-transmitting area;

wherein the second sub-pixel further comprises a second driving device electrically connected to the second pixel electrode, the second driving device is adjacent to the first driving device and located in the driving device area;

the second light-transmitting area has an area greater than an area of the first light-transmitting area;

the array substrate further comprises data lines arranged at intervals in the first direction and scan lines arranged at intervals in the second direction, the data lines and the scan lines intersect to define multiple pixel areas, the first sub-pixels and the second sub-pixels are respectively located in the pixel areas in a one-to-one correspondence;

the first driving device and second driving device in each driving device area are connected to two different ones of the data lines, each data line connects to multiple first driving devices and multiple second driving devices which are the first driving device in each driving area located to one side of the data line and the second driving device in each driving area located to the other side of the data line, and the first driving devices and the second driving devices connected to the same data line are arranged alternately; and each second driving device comprises a second gate and a second source corresponding to the second gate, the second source is connected to one of the data lines connected to the second driving device, and the one of the data lines connected to the second driving device has a first notch at a position corresponding to the second source.

* * * * *